US011158614B2

(12) United States Patent
Cheng et al.

(10) Patent No.: US 11,158,614 B2
(45) Date of Patent: Oct. 26, 2021

(54) THERMAL PERFORMANCE STRUCTURE FOR SEMICONDUCTOR PACKAGES AND METHOD OF FORMING SAME

(71) Applicant: Taiwan Semiconductor Manufacturing Company, Ltd., Hsinchu (TW)

(72) Inventors: Jung Wei Cheng, Sinpu Township (TW); Tsung-Ding Wang, Tainan (TW); Mirng-Ji Lii, Sinpu Township (TW); Chien-Hsun Lee, Chu-tung Town (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 156 days.

(21) Appl. No.: 15/595,782

(22) Filed: May 15, 2017

(65) Prior Publication Data
US 2017/0250166 A1     Aug. 31, 2017

Related U.S. Application Data

(62) Division of application No. 14/181,367, filed on Feb. 14, 2014, now Pat. No. 9,653,443.

(51) Int. Cl.
*H01L 25/10*     (2006.01)
*H01L 21/00*     (2006.01)
(Continued)

(52) U.S. Cl.
CPC ............ *H01L 25/105* (2013.01); *H01L 23/36* (2013.01); *H01L 23/5385* (2013.01);
(Continued)

(58) Field of Classification Search
CPC ......... H01L 23/36; H01L 24/19; H01L 25/03; H01L 25/10
See application file for complete search history.

(56) References Cited

U.S. PATENT DOCUMENTS

| 4,728,751 A | 3/1988 | Canestaro et al. |
| 4,811,082 A | 3/1989 | Jacobs et al. |

(Continued)

FOREIGN PATENT DOCUMENTS

| JP | 2008103536 A | 5/2008 |
| JP | 4339309 | 10/2009 |

(Continued)

OTHER PUBLICATIONS

Kurita et al., "SMAFTI Package Technology Features Wide-Band and Large-Capacity Memory", Innovative Common Technologies to Support State-of-the-Art Products, pp. 52-56.
(Continued)

*Primary Examiner* — Kenneth Parker
*Assistant Examiner* — Long H Le
(74) *Attorney, Agent, or Firm* — Slater Matsil, LLP

(57) ABSTRACT

An embodiment device includes a first die, a second die electrically connected to the first die, and a heat dissipation surface on a surface of the second die. The device further includes a package substrate electrically connected to the first die. The package substrate includes a through-hole, and the second die is at least partially disposed in the through hole.

18 Claims, 17 Drawing Sheets

(51) Int. Cl.
*H01L 25/00* (2006.01)
*H01L 23/36* (2006.01)
*H01L 23/538* (2006.01)
*H01L 23/00* (2006.01)
*H01L 25/03* (2006.01)
*H01L 21/66* (2006.01)
*H01L 23/13* (2006.01)
*H01L 23/498* (2006.01)

(52) U.S. Cl.
CPC .......... *H01L 23/5389* (2013.01); *H01L 24/14* (2013.01); *H01L 24/19* (2013.01); *H01L 24/20* (2013.01); *H01L 24/96* (2013.01); *H01L 24/97* (2013.01); *H01L 25/03* (2013.01); *H01L 25/50* (2013.01); *H01L 22/14* (2013.01); *H01L 23/13* (2013.01); *H01L 23/49816* (2013.01); *H01L 2224/0401* (2013.01); *H01L 2224/04105* (2013.01); *H01L 2224/12105* (2013.01); *H01L 2224/131* (2013.01); *H01L 2224/13025* (2013.01); *H01L 2224/13082* (2013.01); *H01L 2224/141* (2013.01); *H01L 2224/1403* (2013.01); *H01L 2224/16227* (2013.01); *H01L 2224/16235* (2013.01); *H01L 2224/16238* (2013.01); *H01L 2224/19* (2013.01); *H01L 2224/32225* (2013.01); *H01L 2224/32245* (2013.01); *H01L 2224/73204* (2013.01); *H01L 2224/73253* (2013.01); *H01L 2224/73267* (2013.01); *H01L 2224/81005* (2013.01); *H01L 2224/81192* (2013.01); *H01L 2224/81815* (2013.01); *H01L 2224/83005* (2013.01); *H01L 2224/9222* (2013.01); *H01L 2224/92125* (2013.01); *H01L 2224/97* (2013.01); *H01L 2225/06513* (2013.01); *H01L 2225/06517* (2013.01); *H01L 2225/06541* (2013.01); *H01L 2225/06565* (2013.01); *H01L 2225/06589* (2013.01); *H01L 2225/1023* (2013.01); *H01L 2225/1041* (2013.01); *H01L 2225/1058* (2013.01); *H01L 2225/1082* (2013.01); *H01L 2225/1094* (2013.01); *H01L 2924/12042* (2013.01); *H01L 2924/15151* (2013.01); *H01L 2924/15153* (2013.01); *H01L 2924/15159* (2013.01); *H01L 2924/15192* (2013.01); *H01L 2924/15311* (2013.01); *H01L 2924/15321* (2013.01); *H01L 2924/16235* (2013.01); *H01L 2924/16251* (2013.01); *H01L 2924/181* (2013.01); *H01L 2924/18161* (2013.01); *H01L 2924/18162* (2013.01)

(56) References Cited

U.S. PATENT DOCUMENTS

| | | |
|---|---|---|
| 4,990,462 A | 2/1991 | Sliwa, Jr. |
| 5,075,253 A | 12/1991 | Sliwa, Jr. |
| 5,380,681 A | 1/1995 | Hsu |
| 5,481,133 A | 1/1996 | Hsu |
| 5,818,404 A | 10/1998 | Lebby et al. |
| 5,895,978 A | 4/1999 | Palagonia |
| 5,977,640 A | 11/1999 | Bertin et al. |
| 6,002,177 A | 12/1999 | Gaynes et al. |
| 6,025,648 A | 2/2000 | Takahashi et al. |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,271,469 B1 | 8/2001 | Ma et al. |
| 6,279,815 B1 | 8/2001 | Correia et al. |
| 6,355,501 B1 | 3/2002 | Fung et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,600,222 B1 | 7/2003 | Levardo |
| 6,603,072 B1 | 8/2003 | Foster et al. |
| 6,607,938 B2 | 8/2003 | Kwon et al. |
| 6,661,085 B2 | 12/2003 | Kellar et al. |
| 6,762,076 B2 | 7/2004 | Kim et al. |
| 6,790,748 B2 | 7/2004 | Kim et al. |
| 6,791,195 B2 | 9/2004 | Urushima |
| 6,879,041 B2 | 4/2005 | Yamamoto et al. |
| 6,887,769 B2 | 5/2005 | Kellar et al. |
| 6,908,565 B2 | 6/2005 | Kim et al. |
| 6,908,785 B2 | 6/2005 | Kim |
| 6,921,968 B2 | 7/2005 | Chung |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 6/2006 | Kellar et al. |
| 7,056,807 B2 | 6/2006 | Kellar et al. |
| 7,087,538 B2 | 8/2006 | Staines et al. |
| 7,098,542 B1 | 8/2006 | Hoang et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,217,994 B2 | 5/2007 | Zhu et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,443,030 B2 | 10/2008 | Muthukumar et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,632,719 B2 | 12/2009 | Choi et al. |
| 7,659,632 B2 | 2/2010 | Tsao et al. |
| 7,834,450 B2 | 11/2010 | Kang |
| 7,928,582 B2 | 4/2011 | Hutto |
| 8,063,654 B2 | 11/2011 | Rahman et al. |
| 8,164,171 B2 | 8/2012 | Lin et al. |
| 8,284,561 B2 | 10/2012 | Su et al. |
| 8,361,842 B2 | 1/2013 | Yu et al. |
| 8,519,537 B2 | 8/2013 | Jeng et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,796,846 B2 | 8/2014 | Lin et al. |
| 8,803,306 B1 | 8/2014 | Yu et al. |
| 8,803,332 B2 | 8/2014 | Lee et al. |
| 8,809,996 B2 | 8/2014 | Chen et al. |
| 8,829,676 B2 | 9/2014 | Yu et al. |
| 8,877,554 B2 | 11/2014 | Tsai et al. |
| 8,896,109 B2 | 11/2014 | Pagaila et al. |
| 8,933,551 B2 | 1/2015 | Chang et al. |
| 8,970,023 B2 | 3/2015 | Chou et al. |
| 9,129,929 B2 | 9/2015 | Lundberg |
| 9,202,782 B2 | 12/2015 | Chuah |
| 9,653,442 B2 | 5/2017 | Yu et al. |
| 2002/0003232 A1 | 1/2002 | Ahn et al. |
| 2002/0003297 A1 | 1/2002 | Smola et al. |
| 2002/0081755 A1 | 6/2002 | Degani et al. |
| 2003/0035270 A1 | 2/2003 | Shieh et al. |
| 2004/0056344 A1 | 3/2004 | Ogawa et al. |
| 2004/0245608 A1 | 12/2004 | Huang et al. |
| 2005/0009259 A1 | 1/2005 | Farnworth |
| 2005/0104196 A1 | 5/2005 | Kashiwazaki |
| 2006/0113653 A1 | 6/2006 | Xiaoqi et al. |

(56) References Cited

U.S. PATENT DOCUMENTS

| | | |
|---|---|---|
| 2006/0145328 A1 | 7/2006 | Hsu |
| 2006/0249828 A1 | 11/2006 | Hong |
| 2007/0196953 A1 | 8/2007 | Fasano et al. |
| 2007/0289127 A1 | 12/2007 | Hurwitz et al. |
| 2007/0290319 A1 | 12/2007 | Kim |
| 2008/0116589 A1 | 3/2008 | Sinha |
| 2008/0150125 A1* | 6/2008 | Braunisch ........... H01L 25/0657 257/712 |
| 2008/0157316 A1 | 7/2008 | Yang |
| 2008/0185713 A1* | 8/2008 | Dani ..................... H01L 23/10 257/713 |
| 2008/0185719 A1 | 8/2008 | Cablao et al. |
| 2008/0248610 A1 | 10/2008 | Chew et al. |
| 2008/0265434 A1 | 11/2008 | Palaniappan et al. |
| 2008/0272477 A1 | 11/2008 | Do et al. |
| 2008/0283992 A1 | 11/2008 | Palaniappan et al. |
| 2008/0315372 A1 | 12/2008 | Kuan et al. |
| 2009/0065927 A1 | 3/2009 | Meyer |
| 2009/0121326 A1 | 5/2009 | Kim et al. |
| 2009/0186446 A1 | 7/2009 | Kwon et al. |
| 2009/0230409 A1* | 9/2009 | Basin ..................... H01L 33/54 257/88 |
| 2009/0230531 A1 | 9/2009 | Do et al. |
| 2009/0243065 A1 | 10/2009 | Sugino et al. |
| 2009/0309212 A1 | 12/2009 | Shim et al. |
| 2009/0321921 A1 | 12/2009 | Hwang |
| 2010/0019370 A1 | 1/2010 | Pressel et al. |
| 2010/0052135 A1 | 3/2010 | Shim et al. |
| 2010/0102428 A1 | 4/2010 | Lee et al. |
| 2010/0244219 A1 | 9/2010 | Pagaila et al. |
| 2010/0244223 A1 | 9/2010 | Cho et al. |
| 2010/0276787 A1 | 11/2010 | Yu et al. |
| 2010/0289134 A1 | 11/2010 | Chow et al. |
| 2010/0314749 A1 | 12/2010 | Kurita |
| 2010/0327419 A1 | 12/2010 | Muthukumar et al. |
| 2011/0024888 A1 | 2/2011 | Pagaila et al. |
| 2011/0068444 A1 | 3/2011 | Chi et al. |
| 2011/0068459 A1 | 3/2011 | Pagaila et al. |
| 2011/0193221 A1 | 8/2011 | Hu et al. |
| 2011/0210444 A1* | 9/2011 | Jeng .................. H01L 23/49827 257/738 |
| 2011/0241192 A1 | 10/2011 | Ding et al. |
| 2011/0278732 A1 | 11/2011 | Yu et al. |
| 2011/0285005 A1 | 11/2011 | Lin et al. |
| 2011/0291288 A1 | 12/2011 | Wu et al. |
| 2011/0304999 A1 | 12/2011 | Yu et al. |
| 2012/0018885 A1 | 1/2012 | Lee et al. |
| 2012/0049352 A1 | 3/2012 | Kang et al. |
| 2012/0075807 A1* | 3/2012 | Refai-Ahmed ..... H01L 25/0652 361/719 |
| 2012/0286407 A1 | 11/2012 | Choi et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0082364 A1 | 4/2013 | Wang et al. |
| 2013/0093097 A1 | 4/2013 | Yu et al. |
| 2013/0119533 A1 | 5/2013 | Chen et al. |
| 2013/0168848 A1 | 7/2013 | Lin et al. |
| 2013/0182402 A1 | 7/2013 | Chen et al. |
| 2013/0200529 A1 | 8/2013 | Lin et al. |
| 2013/0203215 A1 | 8/2013 | Hung et al. |
| 2013/0214426 A1 | 8/2013 | Zhao et al. |
| 2013/0249532 A1 | 9/2013 | Lin et al. |
| 2013/0307140 A1 | 11/2013 | Huang et al. |
| 2014/0084441 A1* | 3/2014 | Chiu ..................... H01L 23/13 257/692 |
| 2014/0091473 A1 | 4/2014 | Len et al. |
| 2014/0131858 A1 | 5/2014 | Pan et al. |
| 2014/0203429 A1 | 7/2014 | Yu et al. |
| 2014/0210101 A1 | 7/2014 | Lin et al. |
| 2014/0217610 A1 | 8/2014 | Jeng |
| 2014/0225222 A1 | 8/2014 | Yu et al. |
| 2014/0252646 A1 | 9/2014 | Hung et al. |
| 2014/0252647 A1 | 9/2014 | Huang et al. |
| 2014/0264930 A1 | 9/2014 | Yu et al. |
| 2014/0353823 A1 | 12/2014 | Park et al. |
| 2015/0061149 A1 | 3/2015 | Lin et al. |
| 2015/0091131 A1 | 4/2015 | Lamorey et al. |
| 2015/0187743 A1 | 7/2015 | Yu et al. |
| 2015/0235915 A1 | 8/2015 | Liang et al. |
| 2015/0235936 A1 | 8/2015 | Yu et al. |
| 2015/0235989 A1 | 8/2015 | Yu et al. |
| 2015/0235990 A1 | 8/2015 | Cheng et al. |
| 2017/0229432 A1 | 8/2017 | Lin et al. |
| 2017/0338177 A1 | 11/2017 | Lin et al. |
| 2017/0345788 A1 | 11/2017 | Pan et al. |

FOREIGN PATENT DOCUMENTS

| | | |
|---|---|---|
| KR | 20090028687 A | 3/2009 |
| KR | 20090122277 A | 11/2009 |
| KR | 20100119507 A | 11/2010 |
| KR | 20120019091 A | 3/2012 |
| KR | 20130077031 A | 7/2013 |

OTHER PUBLICATIONS

Motohashi et al., "SMAFTI Package with Planarized Multilayer Interconnects", IEEE, Electronic Components and Technology Conference, 2009, pp. 599-606.

Ranganathan, N., et al., Integration of High Aspect Ratio Tapered Silicon Via for Through-Silicon Interconnection 58th Electronic Components and Technology Conference, ECTC 2008., May 2008, pp. 859-865, IEEE, Lake Buena Vista, Florida, United States.

Kurita et al., "SMAFTI Packaging Technology for New Interconnect Hierarchy", IEEE, NEC Electronics Corporation Sagamihara, Kanagawa, 229-1198, Japan, 2009, pp. 220-222.

* cited by examiner

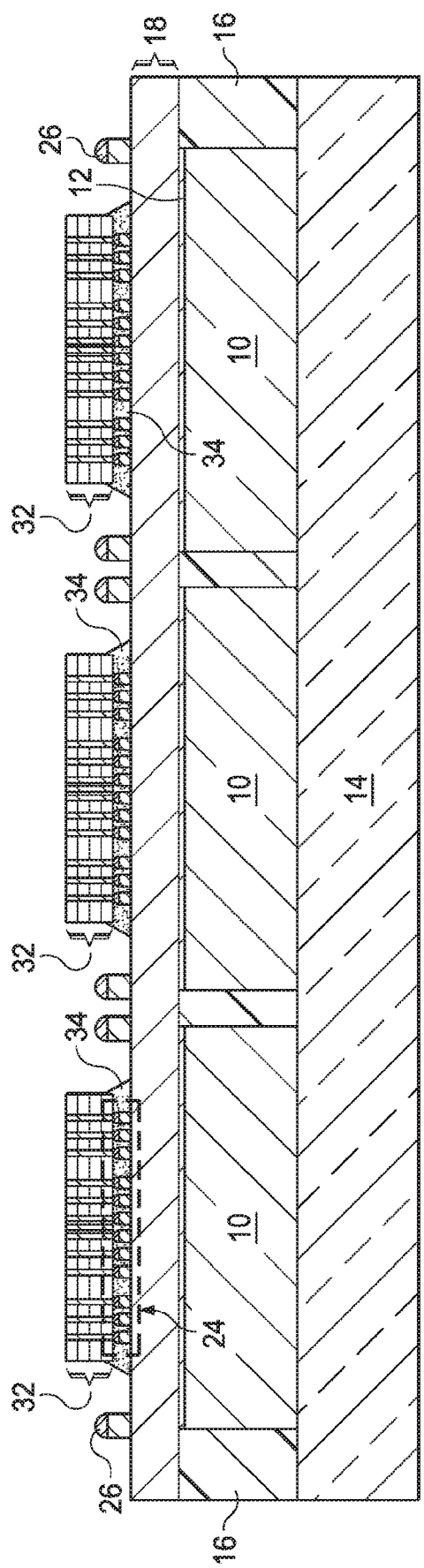
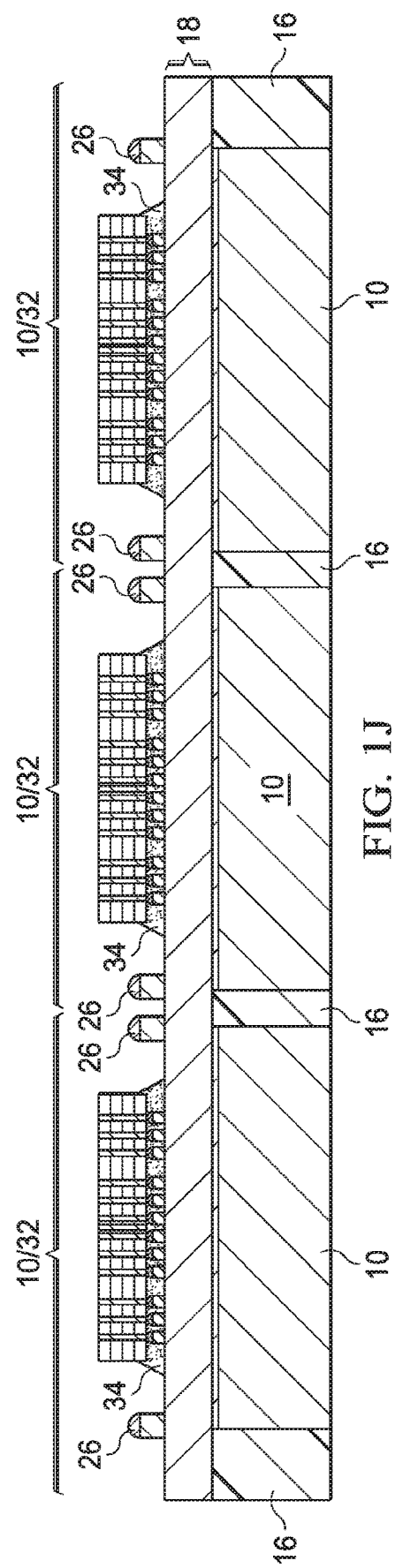
FIG. 1I
FIG. 1J

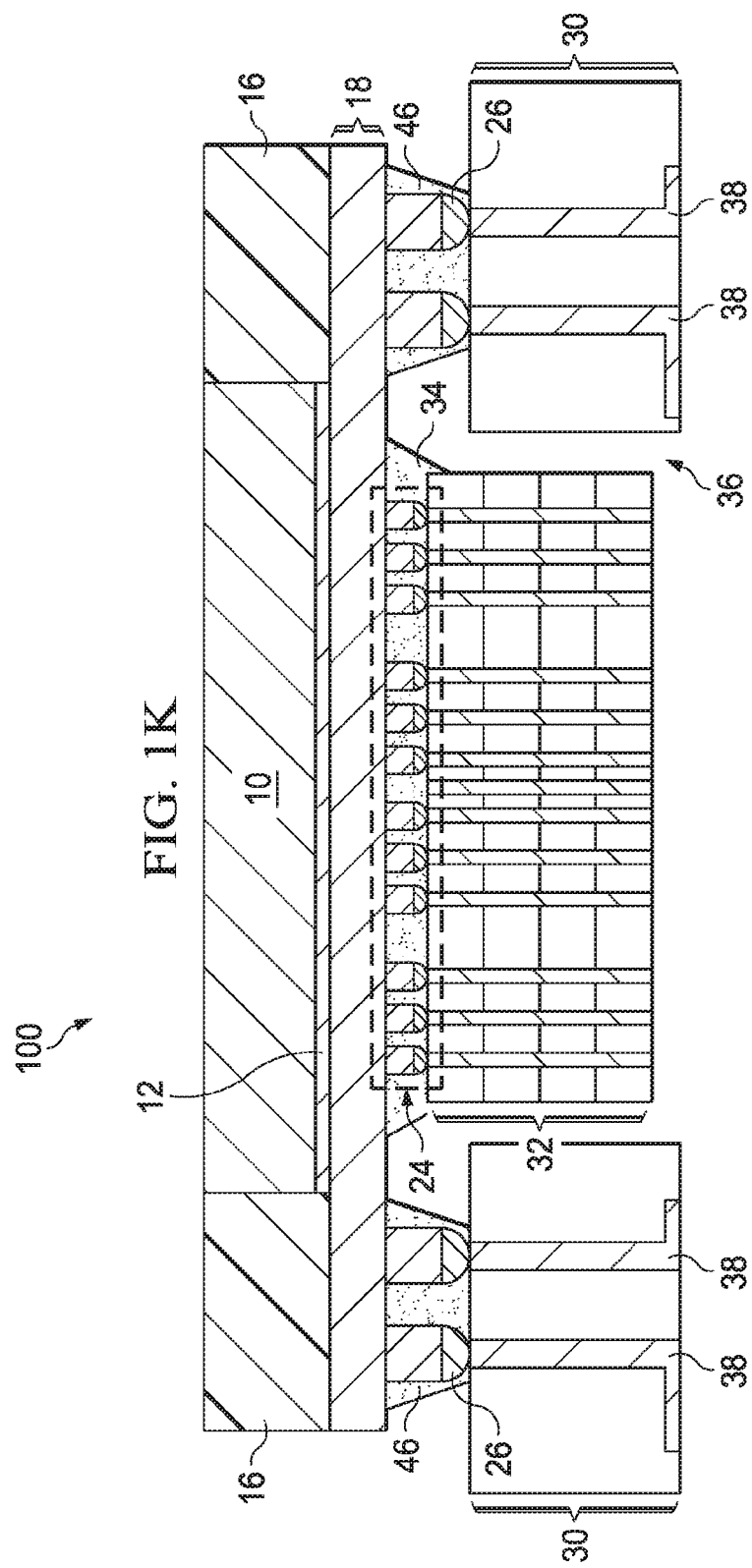

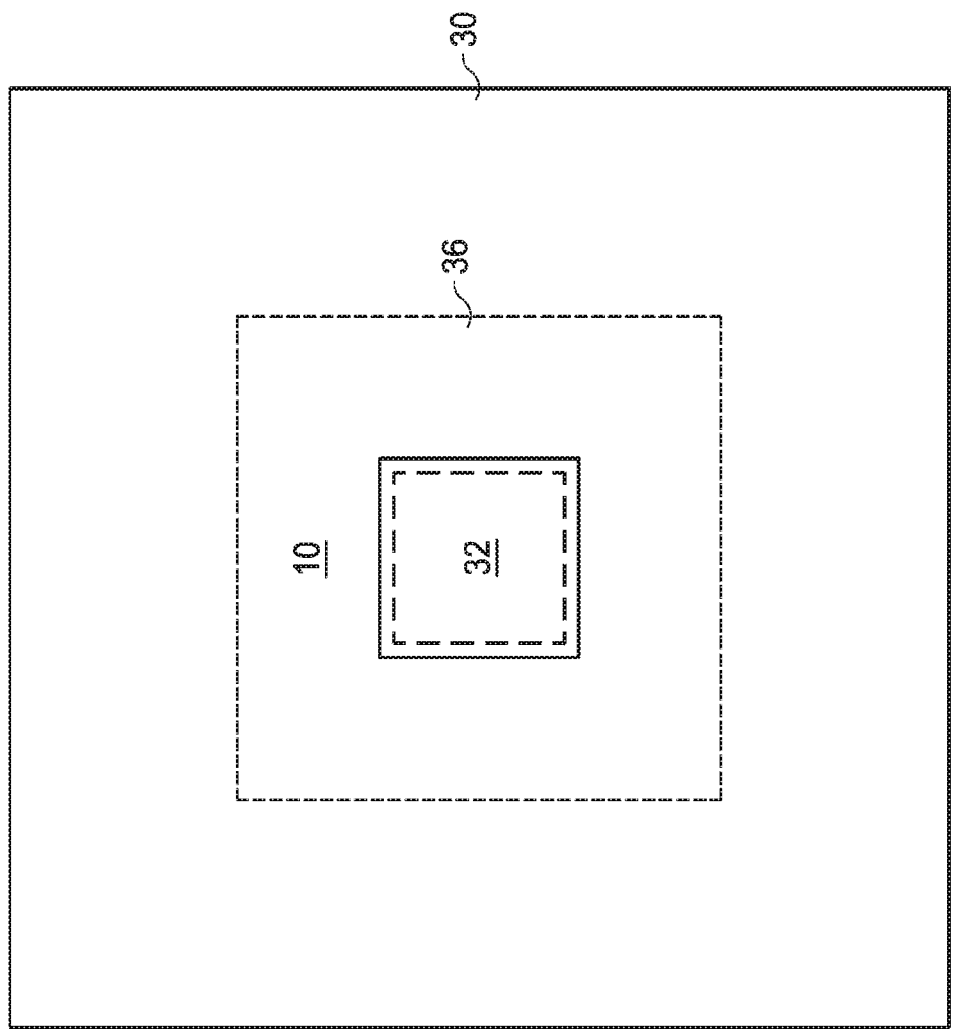

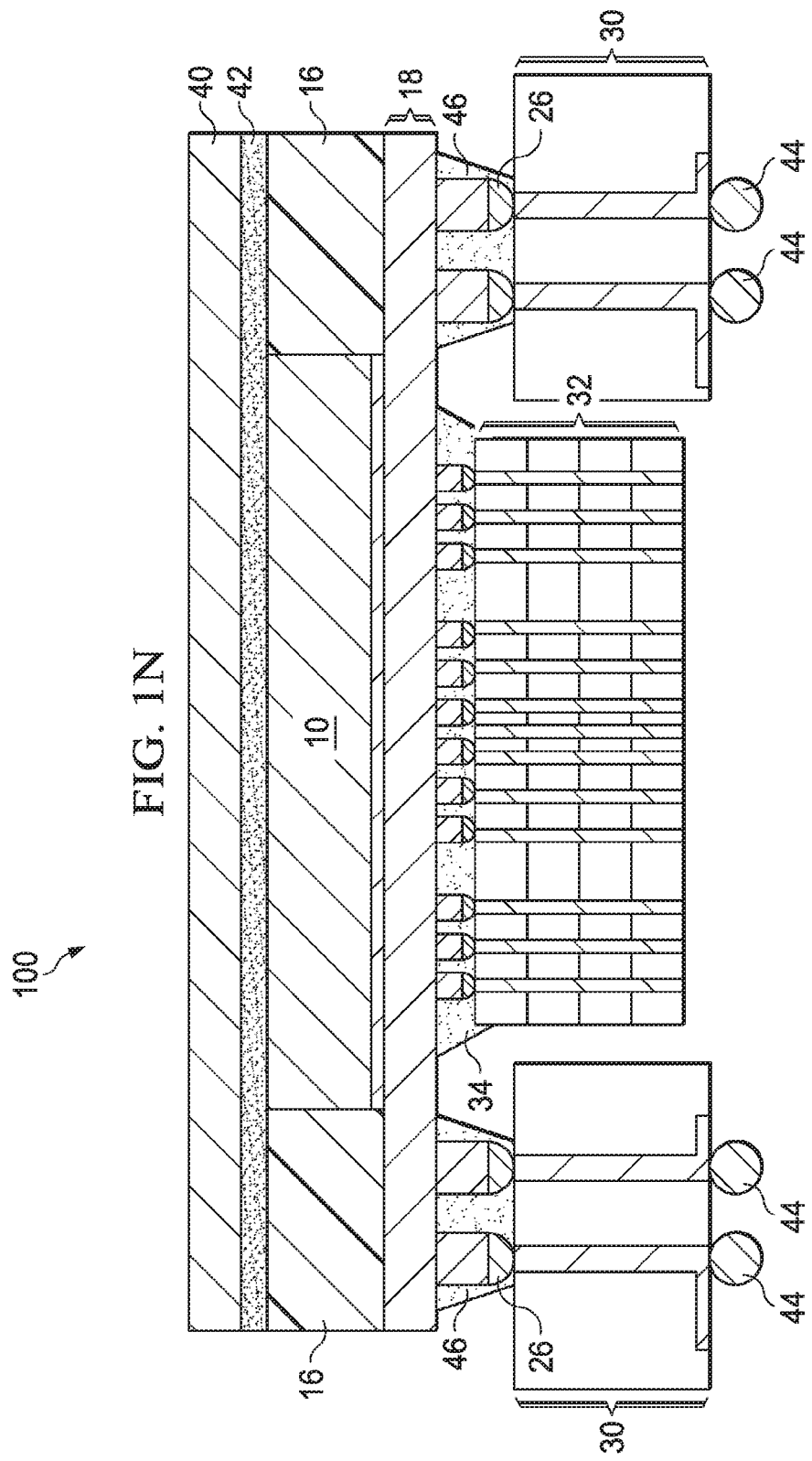

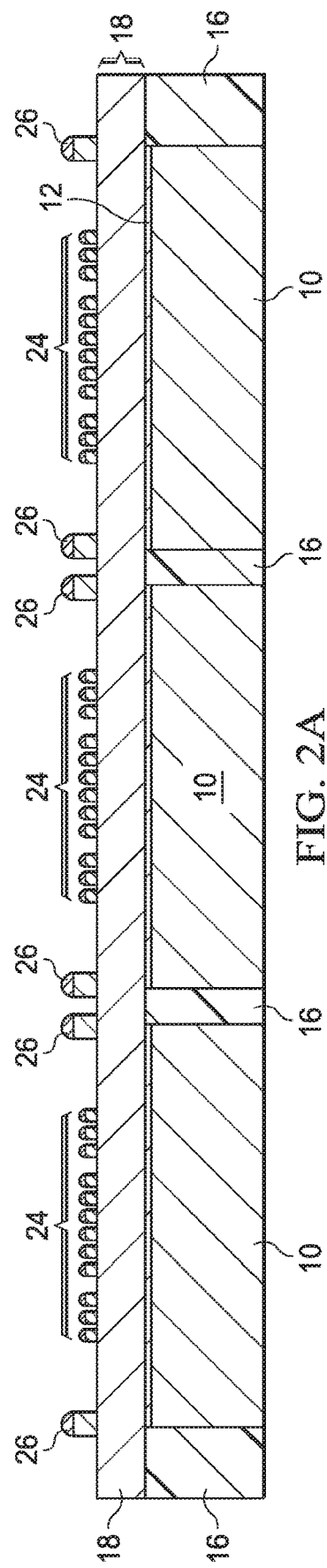
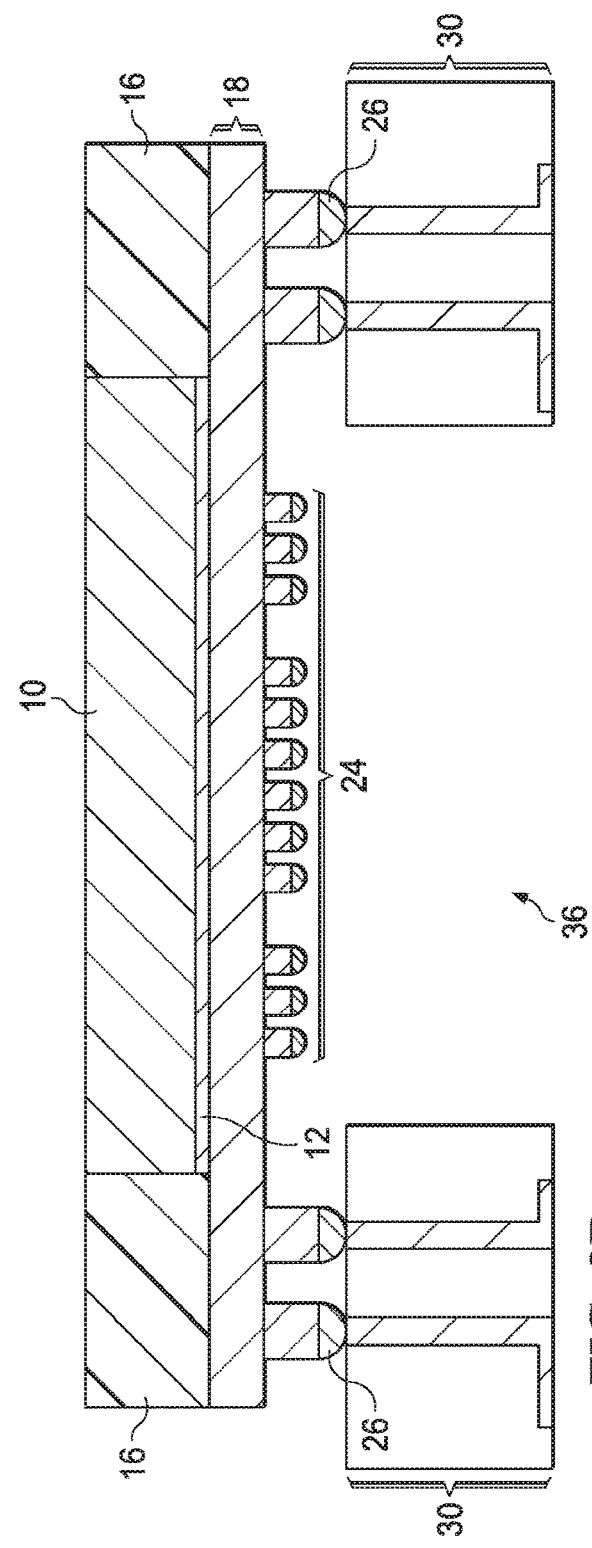
FIG. 2A
FIG. 2B

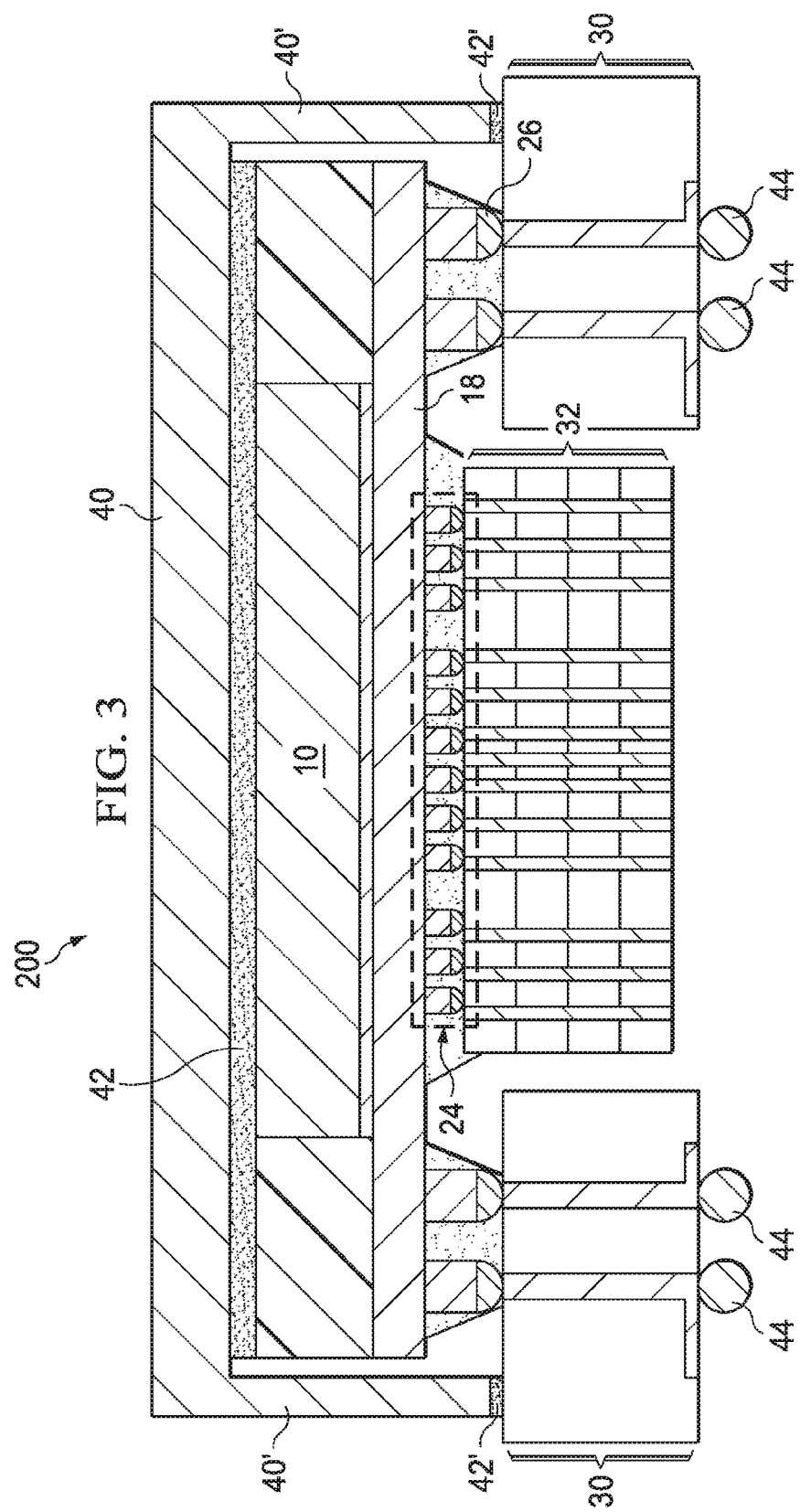

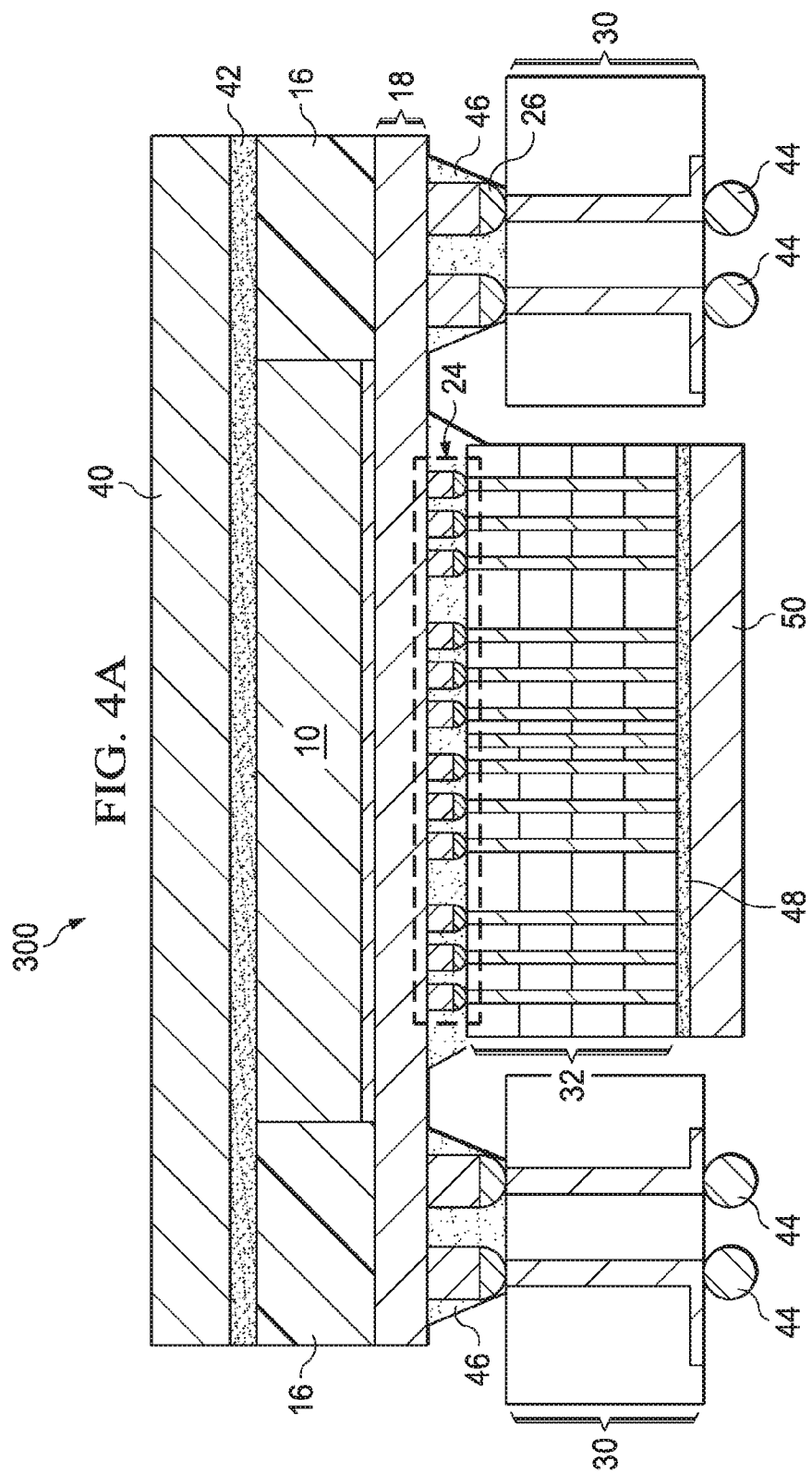

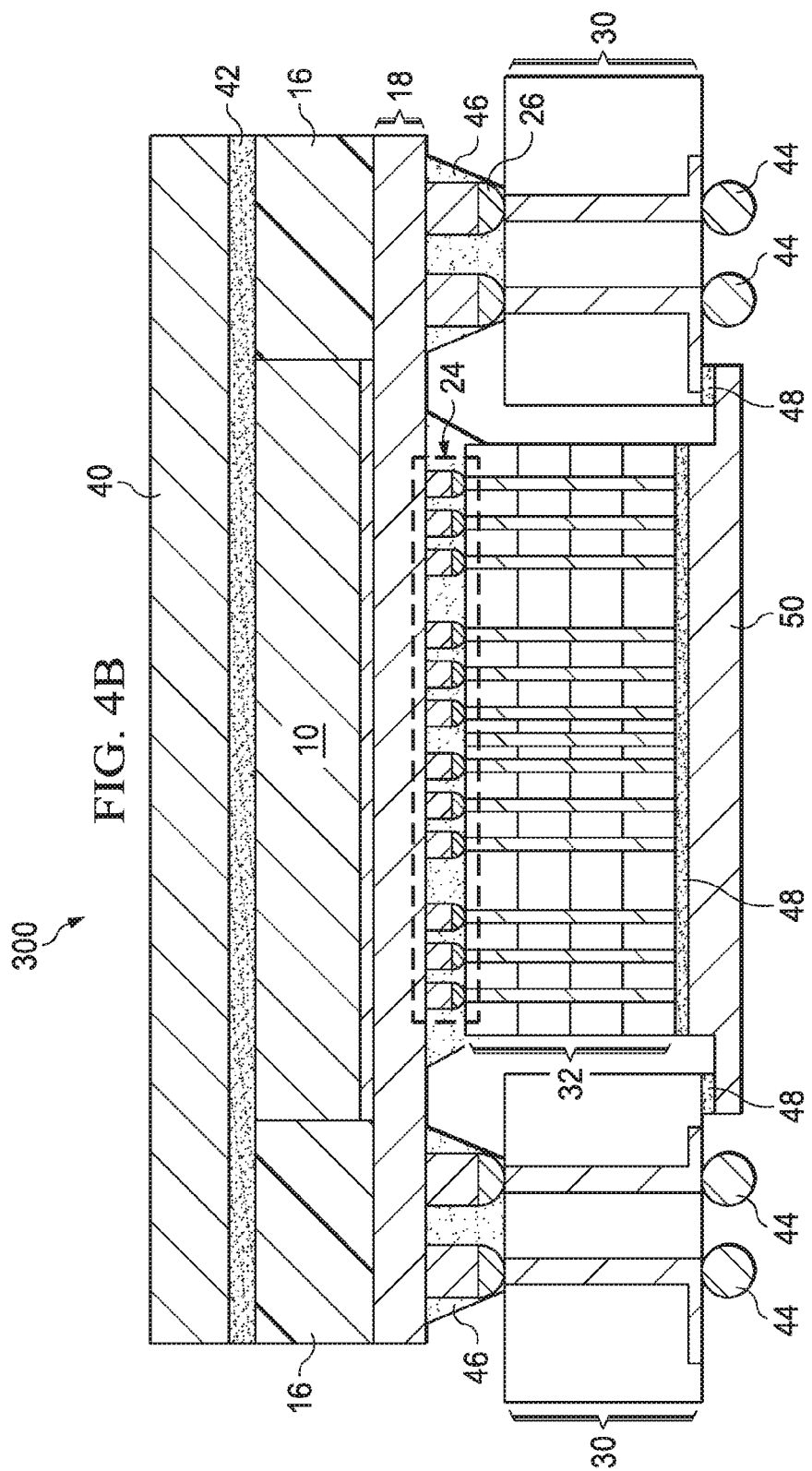

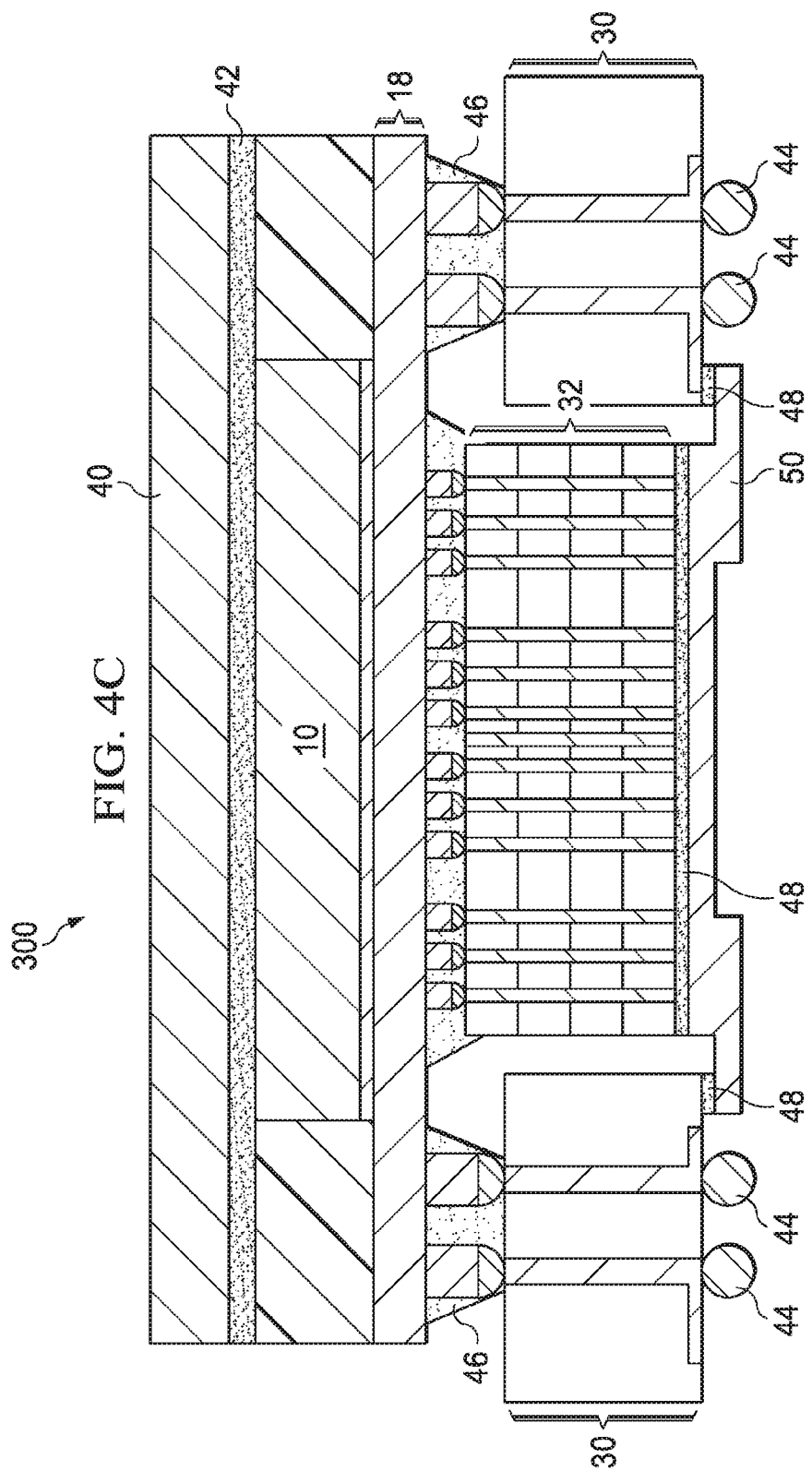

THERMAL PERFORMANCE STRUCTURE FOR SEMICONDUCTOR PACKAGES AND METHOD OF FORMING SAME

PRIORITY CLAIM AND CROSS-REFERENCE

This application is a divisional of U.S. patent application Ser. No. 14/181,367, filed on Feb. 14, 2014, entitled "Thermal Performance Structure for Semiconductor Packages and Method of Forming Same," which relates to the following co-pending and commonly assigned patent application: U.S. patent application Ser. No. 14/181,305, filed Feb. 14, 2014, entitled "Substrate Design for Semiconductor Packages and Method of Forming Same," which applications are hereby incorporated herein by reference.

BACKGROUND

In an aspect of integrated circuit packaging technologies, individual semiconductor dies may formed and are initially isolated. These semiconductor dies may then be bonded together, and the resulting die stack may be connected to other package components such as package substrates (e.g., interposers, printed circuit boards, and the like) using connectors on a bottom die of the die stack.

The resulting packages are known as Three-Dimensional Integrated Circuits (3DICs). Top dies of a die stack may be electrically connected to the other package components through interconnect structures (e.g., through-substrate vias (TSVs)) in bottom dies of the die stack. However, existing 3DIC packages may include numerous limitations. For example, the bonded die stack and other package components may result in a large form factor and may require complex heat dissipation features. Furthermore, existing interconnect structures (e.g., TSVs) of the bottom die may be costly to manufacture and result in long conduction paths (e.g., signal/power paths) to top dies of the die stack.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A through 2D illustrate cross-sectional views of various intermediary stages of manufacturing a semiconductor package in accordance with some alternative embodiments;

FIG. 3 illustrates a cross-sectional view a semiconductor package in accordance with some alternative embodiments; and FIGS. 4A through 4E illustrate cross-sectional views of a semiconductor package in accordance with some alternative embodiments.

DETAILED DESCRIPTION

Figure 1A:
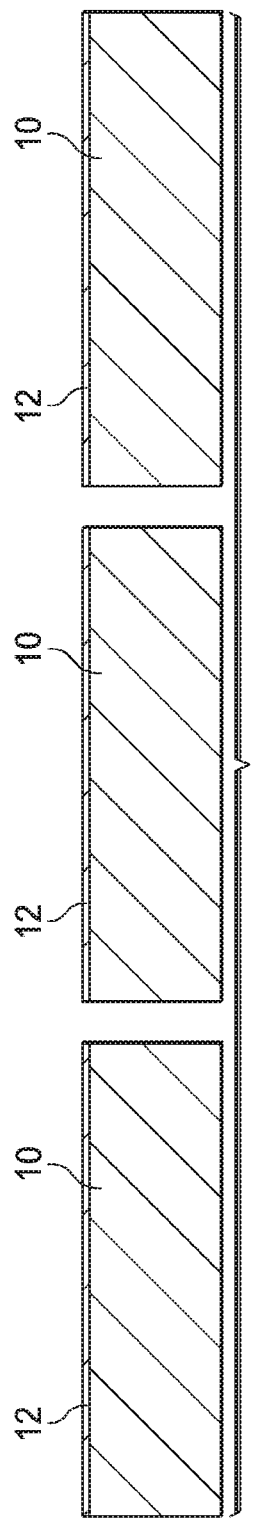
FIGS. 1A through 1N illustrate cross-sectional views of various intermediary stages of manufacturing a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments may include a plurality of first dies (e.g., memory dies) electrically connected to one or more second dies (e.g., logic dies) through first input/output (I/O) pads and redistribution layers (RDLs) formed on the second dies. The resulting die stack may be bonded to another package component such as an interposer, package substrate, printed circuit board, and the like through second I/O pads and the RDLs of the second dies. The first and second I/O pads may be formed on a same surface of the second dies. A through-hole may be formed in the other package component, and the first dies may be disposed in the through-hole. Electrical connections from the first dies to the other package components may be made through the RDLs and I/O pads. Thus, a three-dimensional integrated circuit (3DIC) such as a chip on fan-out package may be made with a relatively small form factor at a relatively low cost and having relatively short conduction paths (e.g., signal/power paths). Furthermore, one or more heat dissipation features may be independently formed on opposite surfaces of the first and/or second dies.

FIGS. 1A through 1N illustrate cross-sectional views of various intermediary stages of manufacturing an integrated circuit (IC) package 100 (see FIG. 1N) in accordance with various embodiments. FIG. 1A illustrates a plurality of dies 10. Dies 10 may include a substrate, active devices, and interconnect layers (not shown). The substrate may be a bulk silicon substrate although other semiconductor materials including group III, group IV, and group V elements may also be used. Alternatively, the substrate may be a silicon-on-insulator (SOI) substrate. Active devices such as transistors may be formed on the top surface of the substrate. Interconnect layers may be formed over the active devices and the substrate.

The interconnect layers may include an inter-layer dielectric (ILD)/inter-metal dielectric layers (IMDs) formed over the substrate. The ILD and IMDs may be formed of low-k dielectric materials having k values, for example, lower than about 4.0 or even about 2.8. In some embodiments, the ILD and IMDs comprise silicon oxide, SiCOH, and the like.

A contact layer 12 including one or more contact pads is formed over the interconnect structure and may be electrically coupled to the active devices through various metallic lines and vias in the interconnect layers. Contact pads in contact layer 12 may be made of a metallic material such as aluminum, although other metallic materials may also be used. A passivation layer (not shown) may be formed over contact layer 12 out of non-organic materials such as silicon oxide, un-doped silicate glass, silicon oxynitride, and the like. The passivation layer may extend over and cover edge portions of contact pads in contact layer 12. Openings may be formed in portions of the passivation layer that cover the contact pads, exposing at least a portion of the contact pads in contact layer 12. The various features of dies 10 may be formed by any suitable method and are not described in further detail herein. Furthermore, dies 10 may be formed in a wafer (not shown) and singulated. Functional testing may be performed on dies 10. Thus, dies 10 in FIG. 1A may include only known good dies, which have passed one or more functional quality tests.

Figure 1B:
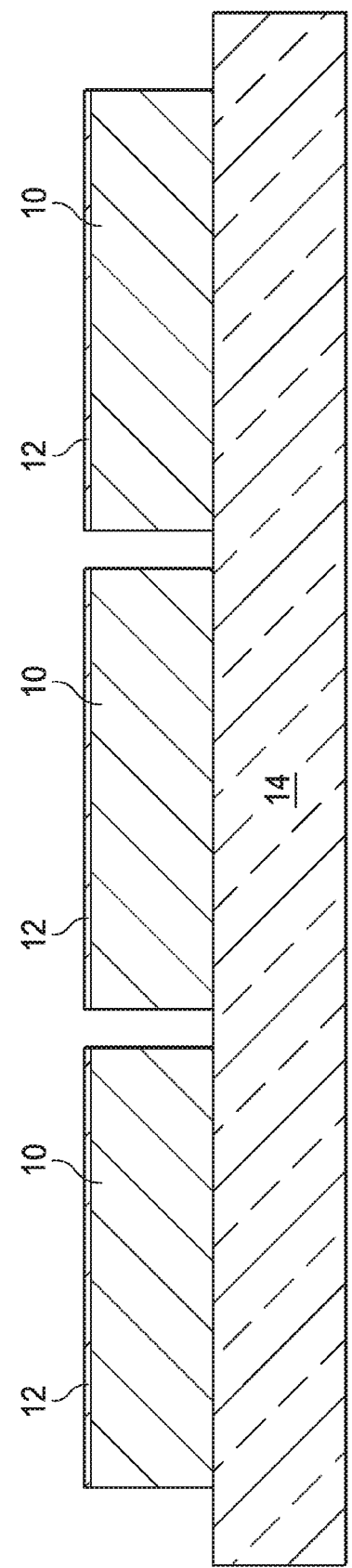

Next, referring to FIG. 1B, dies 10 may be placed on a carrier 14. Carrier 14 may be made of a suitable material, for example, glass or a carrier tape. Dies 10 may be affixed to carrier 14 through one or more adhesive layers (not shown). The adhesive layers may be formed of any temporary adhesive material such as ultraviolet (UV) tape, wax, glue, and the like. In some embodiments, the adhesive layers may further include a die attach film (DAF), which may have optionally been formed under dies 10 prior to their placement on carrier 14.

Figure 1C:
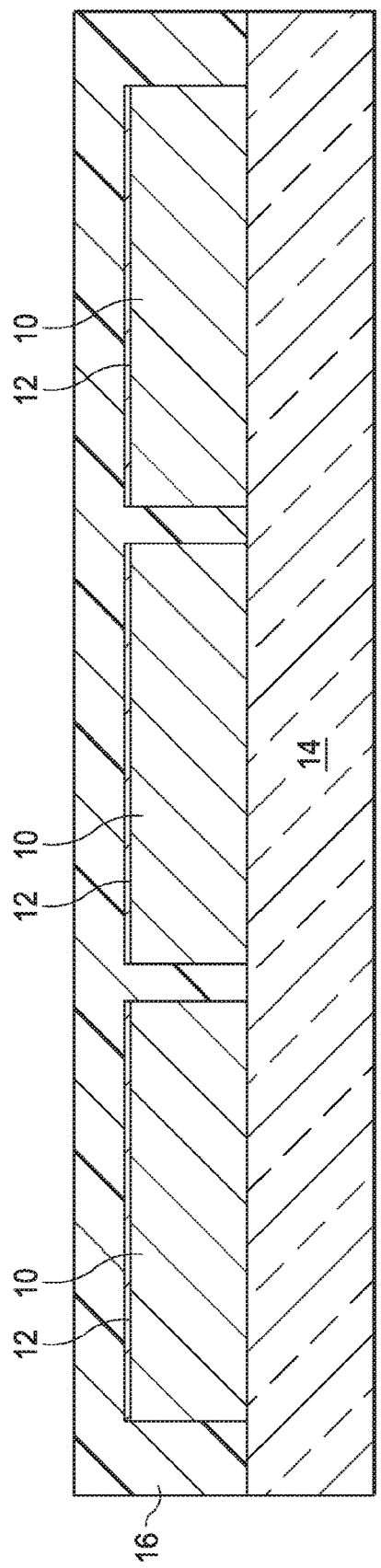

In FIG. 1C, a molding compound 16 may be used to fill gaps between dies 10 and to cover top surfaces of dies 10. Molding compound 16 may include any suitable material such as an epoxy resin, a molding underfill, and the like. Suitable methods for forming molding compound 16 may include compressive molding, transfer molding, liquid encapsulant molding, and the like. For example, molding compound 16 may be dispensed between dies 10 in liquid form. A curing process may then be performed to solidify molding compound 16.

Figure 1D:
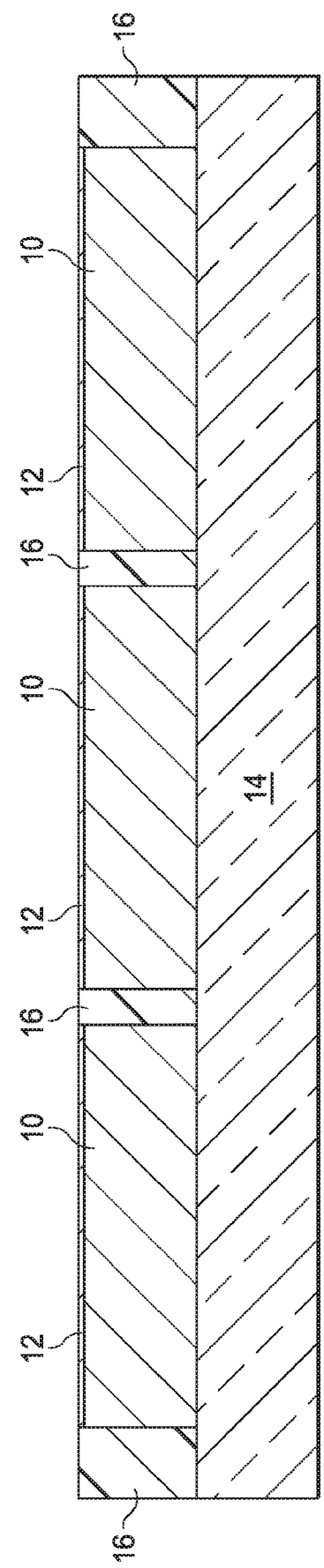

In FIG. 1D, a planarization process, such as a grinding process (e.g., a chemical-mechanical polish (CMP) or mechanical grinding) or etch back, may be performed on molding compound 16 to expose contact layer 12 (and any contact pads therein) on dies 10. In a top down view of dies 10 (not shown), molding compound 16 may encircle dies 10.

Figure 1E:
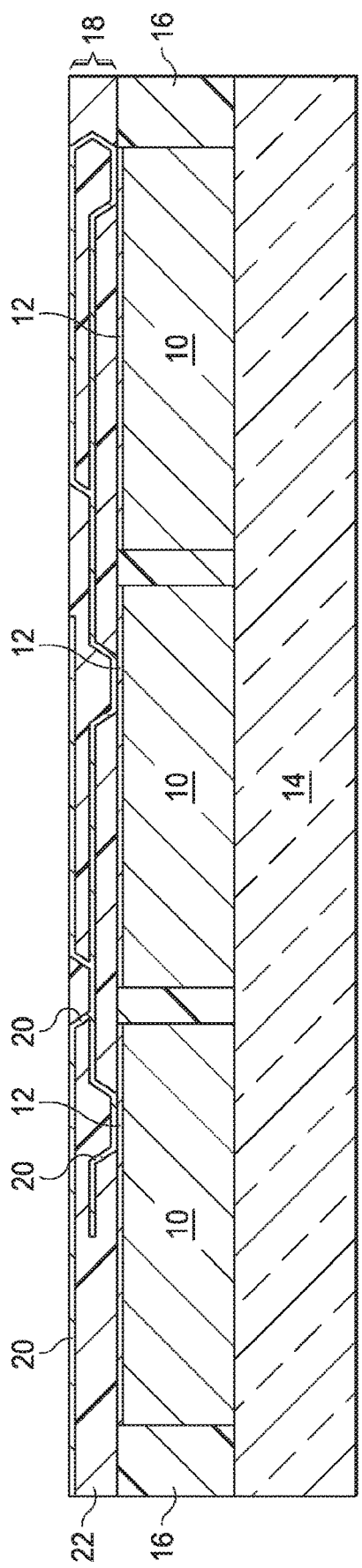

FIG. 1E illustrates the formation of redistribution layers (RDLs) 18 over dies 10 and molding compound 16. As illustrated by FIG. 1E, RDLs 18 may extend laterally past edges of dies 10 over molding compound 16. RDLs 18 may include interconnect structures 20 formed in one or more polymer layers 22. Polymer layers 22 may be formed of any suitable material (e.g., polyimide (PI), polybenzoxazole (PBO), benzocyclobuten (BCB), epoxy, silicone, acrylates, nano-filled pheno resin, siloxane, a fluorinated polymer, polynorbornene, and the like) using any suitable method, such as, a spin-on coating technique, and the like.

Interconnect structures 20 (e.g., conductive lines and/or vias) may be formed in polymer layers 22 and electrically connected to contact layer 12 of dies 10. The formation of interconnect structures 20 may include patterning polymer layers 22 (e.g., using a combination of photolithography and etching processes) and forming interconnect structures 20 (e.g., depositing a seed layer and using a mask layer to define the shape of interconnect structures 20) in the patterned polymer layers 22. Interconnect structures 20 may be formed of copper or a copper alloy although other metals such as aluminum, gold, and the like may also be used. Interconnect structures 20 may be electrically connected to contact pads in contact layer 12 (and as a result, active devices) in dies 10.

Figure 1F:
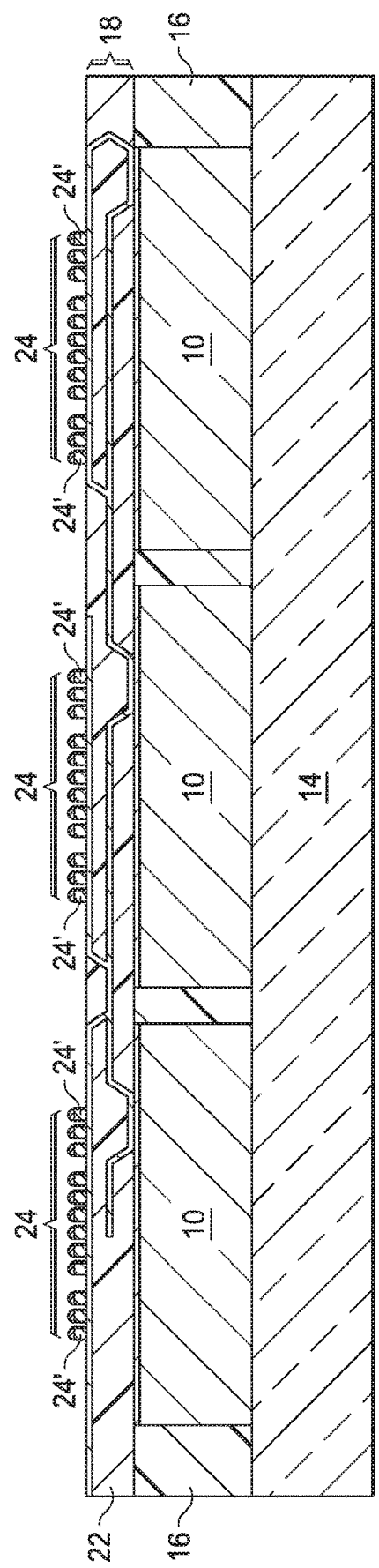
Figure 1G:
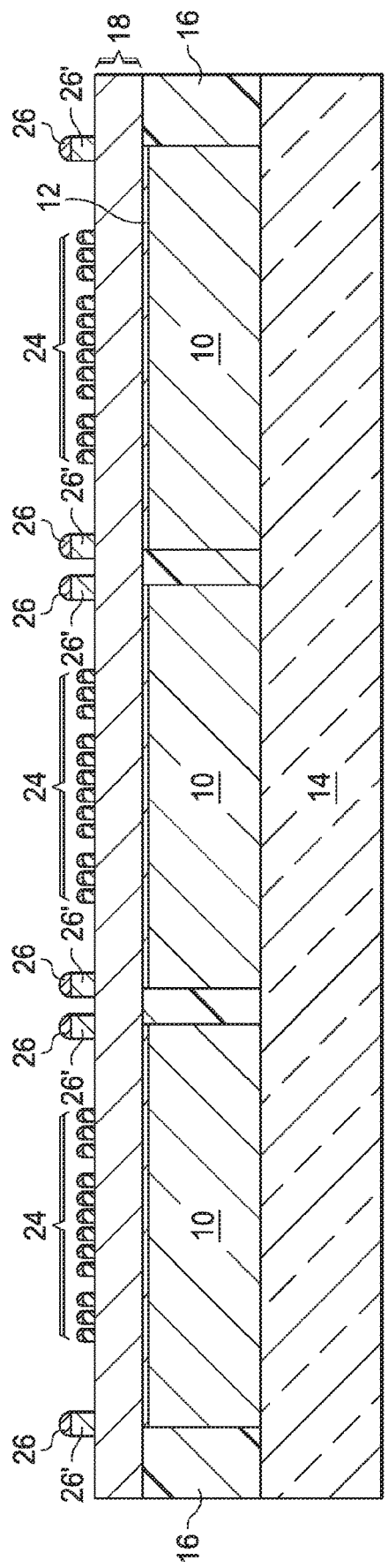

FIGS. 1F and 1G illustrate the formation of connectors 24 and 26 over RDLs 18. Notably, connectors 24 and 26 are formed on a same side of dies 10 (i.e., on a same surface of RDLs 18). Connectors 24 and 26 may be formed of any suitable material (e.g., copper, solder, and the like) using any suitable method. In some embodiments, the formation of connectors 24 and 26 may first include the formation of under bump metallurgies (UBMs) 24'/26' electrically connected to active devices in dies 10 through RDLs 18. Connectors 24 and 26 may extend laterally past edges of dies 10, forming fan-out interconnect structures. Thus, the inclusion of RDLs 18 may increase the number of connectors 24 and 26 (e.g., input/output pads) connected to dies 10. The increased number of connectors 24 and 26 may allow for increased bandwidth, increased processing speed (e.g., due to shorter signaling paths), lower power consumption (e.g., due to shorter power conduction paths), and the like in subsequently formed IC packages (e.g., package 100 of FIG. 1N).

Furthermore, connectors 24 and 26 may vary in size. For example, connectors 24 may be microbumps having a pitch of about 40 μm or more while connectors 26 may be controlled collapse chip connection (C4) bumps having a pitch of about 140 μm to about 150 μm. In alternative embodiments, connectors 24 and 26 may have different dimensions. Thus, as illustrated by FIGS. 1F and 1G, connectors 24 may be formed prior to connectors 26 to allow for the size differences.

The differing sizes of connectors 24 and 26 may allow different electrical devices (e.g., having differently sized connectors) to be bonded to dies 10. For example, connectors 24 may be used to electrically connect dies 10 to one or more other device dies 28 (see FIG. 1H), and connectors 26 may be used to electrically connect dies 10 to a package substrate 30 (e.g., a printed circuit board, interposer, and the like, see FIG. 1K). Furthermore, because connectors 24 and 26 are formed on a same side of dies 10, the different electrical devices may also be bonded to a same side of dies 10. Although a particular configuration of dies 10 and RDLs 18 is illustrated, alternative configurations may be applied (e.g., having a different number of RDLs 18 and/or connectors 24/26) in alternative embodiments.

Figure 1H:
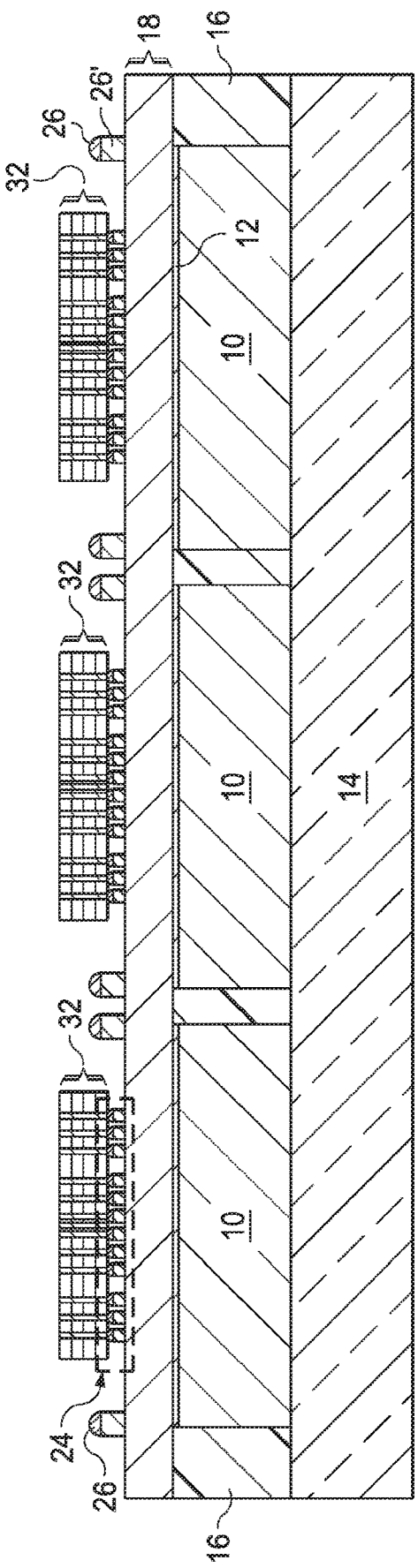

In FIG. 1H, a plurality of dies 32 may be bonded to dies 10 through connectors 24 (e.g., by reflowing connectors 24) to form die stacks 10/32. Dies 32 may be electrically connected to active devices in dies 10 through RDLs 18. In some embodiments, die stack 10/32 may include memory dies 32 (e.g., dynamic random access memory (DRAM) dies) bonded to dies 10, which may be logic dies providing control functionality for memory dies 32. In alternative embodiments, other types of dies may be included in dies stacks 10/32. Next, as illustrated in FIG. 1I, underfill 34 may be dispensed between dies 32 and RDLs 18 around connectors 24. Underfill 34 may provide support for connectors 24.

FIG. 1J illustrates the removal of carrier 14 from die stack 10/32 using any suitable method. For example, in an embodiment in which the adhesive between dies 10 and carrier 14 is formed of UV tape, dies 14 may be removed by exposing the adhesive layer to UV light. Subsequently, die stacks 10/34 may be singulated for packaging in an IC package. The singulation of die stacks 10/34 may include the use of a suitable pick-and-place tool.

Next, as illustrated by FIG. 1K, each die stack 10/32 may be bonded to a package substrate 30 through connectors 26. A reflow may be performed on connectors 26 to bond die stack 10/32 to package substrate 30. Subsequently, an underfill 46 maybe dispensed between die stack 10/32 and package substrate 30 around connectors 26. Underfill 46 may be substantially similar to underfill 34.

Package substrate 30 may be an interposer, a printed circuit board (PCB), and the like. For example, package substrate 30 may include a core and one or more build-up layers disposed on either side of the core (not shown). Interconnect structures 38 (e.g., conductive lines, vias, and/or through vias) may be included in package substrate 30 to provide functional electrical purposes such as power, ground, and/or signal layers. Other configurations of package substrate 30 may also be used.

Furthermore, package substrate 30 may include a through hole 36, which may be formed in package substrate 30 using an suitable method. For example, through hole 36 may be formed using a laser drilling process. The configuration of package substrate 30 may be designed so that active interconnect structures 38 (e.g., power, ground, and/or signal layers) may be routed to avoid through hole 36. Thus, through hole 36 may not substantially interfere with the functionality of package substrate 30.

When die stack 10/34 is bonded to package substrate 30, dies 32 may be disposed, at least partially, in through hole 36. Thus, the bonded structure may advantageously have a relatively small form factor and higher bandwidth. Furthermore, dies 32 may be electrically connected to package substrate 30 through RDLs 18 and connectors 24/26. In some embodiments, dies 10 may include fewer or be substantially free of through-substrate vias (TSVs) for electrically connecting dies 32 to package substrate 30. The reduced number of TSVs may lower the cost of manufacturing dies 10.

In a top down view of package 100 (as illustrated by FIG. 1L), package substrate 30 may encircle die stack 10/32. Dies 32 may be disposed in through hole 36. Although through hole 36 is illustrated as being centrally located in package substrate 30, through-hole 36 may be disposed in other portions of package substrate 30 depending on package configuration.

Figure 1M:
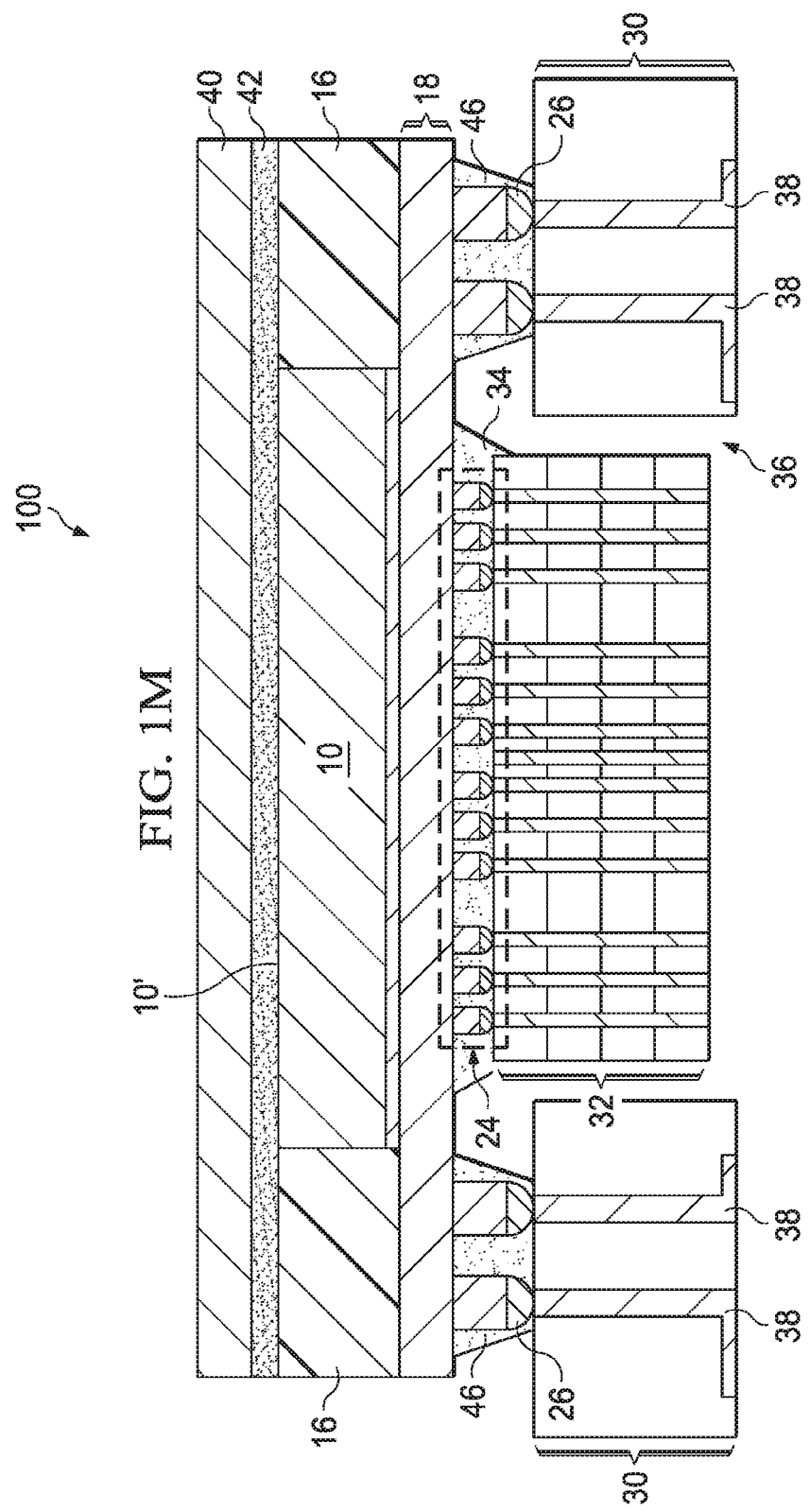

Next, referring to FIG. 1M, a heat dissipation feature 40 is disposed over die 10. Heat dissipation feature 40 may be disposed on a surface of die 10 opposite RDLs 18, connectors 24, and dies 32. Heat dissipation feature 40 may be a contour lid having a high thermal conductivity, for example, between about 200 watts per meter kelvin (W/m·K) to about 400 W/m·K or more, and may be formed using a metal, a metal alloy, and the like. For example, heat dissipation feature 40 may comprise metals and/or metal alloys such as Al, Cu, Ni, Co, combinations thereof, and the like. Heat dissipation feature 40 may also be formed of a composite material, for example silicon carbide, aluminum nitride, graphite, and the like. In some embodiments, heat dissipation feature 40 may also extend over surfaces of molding compound 16.

Compared to conventional 3DICs, where package substrate 30 and dies 32 would be disposed on opposing sides of die 10, package 100 provides die 10 with a surface 10', which may not be used to electrically connect to dies 32 or substrate 30. Thus, heat dissipation feature 40 may be directly disposed on surface 10' of die 10 for improved heat dissipation.

Interfacing material 42 may be disposed between heat dissipation features 40 and die 10/molding compound 16. Interfacing material 42 may include a thermal interface material (TIM), for example, a polymer having a good thermal conductivity, which may be between about 3 watts per meter kelvin (W/m·K) to about 5 W/m·K or more. Because the TIM may have good thermal conductivity, the TIM may be disposed directly between (e.g., contacting) die 10 and heat dissipation feature 40. Furthermore, interfacing material 42 may also include an adhesive (e.g., an epoxy, silicon resin, and the like) for affixing heat dissipation lid 40 to die 10/molding compound 16. The adhesive used may have a better adhering ability and a lower thermal conductivity than a TIM. For example, the adhesive used may have a thermal conductivity lower than about 0.5 W/m·K. As such, the adhesive portions of interfacing material 42 may be disposed over areas having lower thermal dissipation needs (e.g., over surfaces of molding compound 16).

After the attachment of heat dissipation feature 40, a marking process (e.g., laser marking) may be performed to mark package 100. Furthermore, as illustrated by FIG. 1N, connectors 44 (e.g., ball grid array (BGA) balls) disposed on a surface of package substrate 40 opposite connectors 26 and die 10. Connectors 44 may be used to electrically connect package 100 to a motherboard (not shown) or another device component of an electrical system.

FIG. 1N illustrates a completed package 100. Because dies 32 is disposed in a through hole 36 of package substrate 30, package 100 may have a relatively small form factor and higher bandwidth. The inclusion of RDL 18 may allow for a greater number of I/O pads for die stack 10/32, which allows various performance advantages such as increased speed, lower power consumption, and the like. Furthermore, package substrate 30 and dies 32 may be disposed on a same side of die 10, allowing heat dissipation feature 40 to be directly disposed on a surface of die 10 for improved heat dissipation.

Figure 2C:
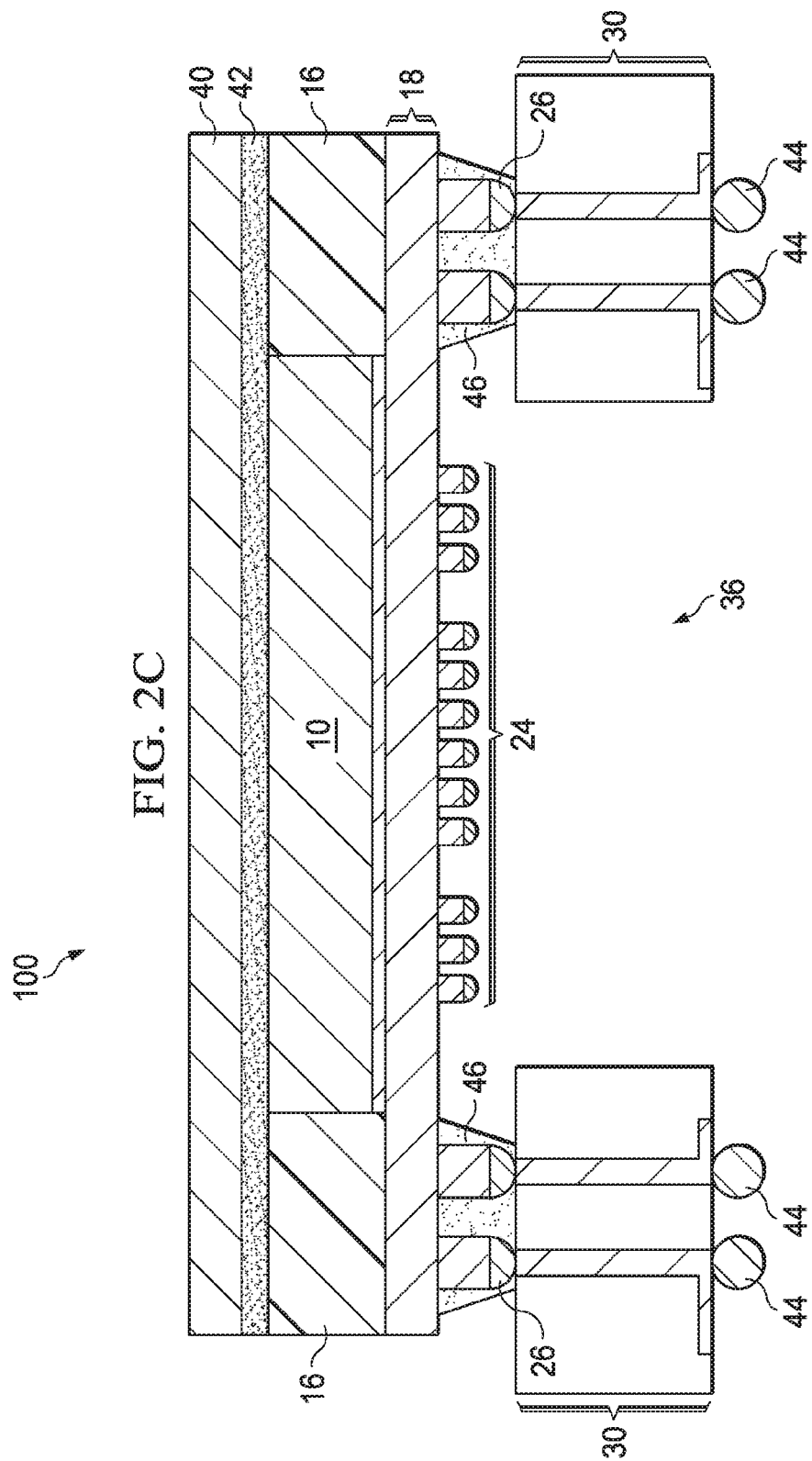

FIGS. 2A through 2D illustrates various intermediary steps of manufacturing package 100 in accordance with alternative embodiments. FIG. 2A illustrates a plurality of dies 10 having an RDL 18 and connectors 24/26 formed over dies 10. The various features illustrated in FIG. 2A may be formed using substantially the same steps and be substantially similar to the features formed in FIGS. 1A through 1J where like reference numerals represent like elements. Thus, detailed description of the features and their formation is omitted for brevity. However, as illustrated by FIG. 2A, dies 10 (including RDL 18 and connectors 24/26) may be detached from a carrier (e.g., carrier 14) prior to the bonding of one or more dies 32 on dies 10.

FIG. 2B illustrates the singulation of dies 10 (e.g., along scribe lines using a suitable pick and place tool) and the attachment of dies 10 to package substrate 30 through connectors 26. Connectors 24 of die 10 may be aligned with through hole 36 of package substrate 30. Notably, die 10 may be bonded to package substrate 30 prior to the attachment of dies 32. FIG. 2C illustrates the formation of various other features of package 100. For example, a reflow may be performed on connectors 26 and underfill 46 may be dispensed around connectors 26. Connectors 44 may be attached to a surface of package substrate 30 opposite die 10. Furthermore, a heat dissipation feature 40 may be disposed over die 10/molding compound 16. An interfacing material 42 (e.g., including a TIM and/or adhesive material) may be disposed between heat dissipation feature 40 and die 10/molding compound 16.

Figure 2D:
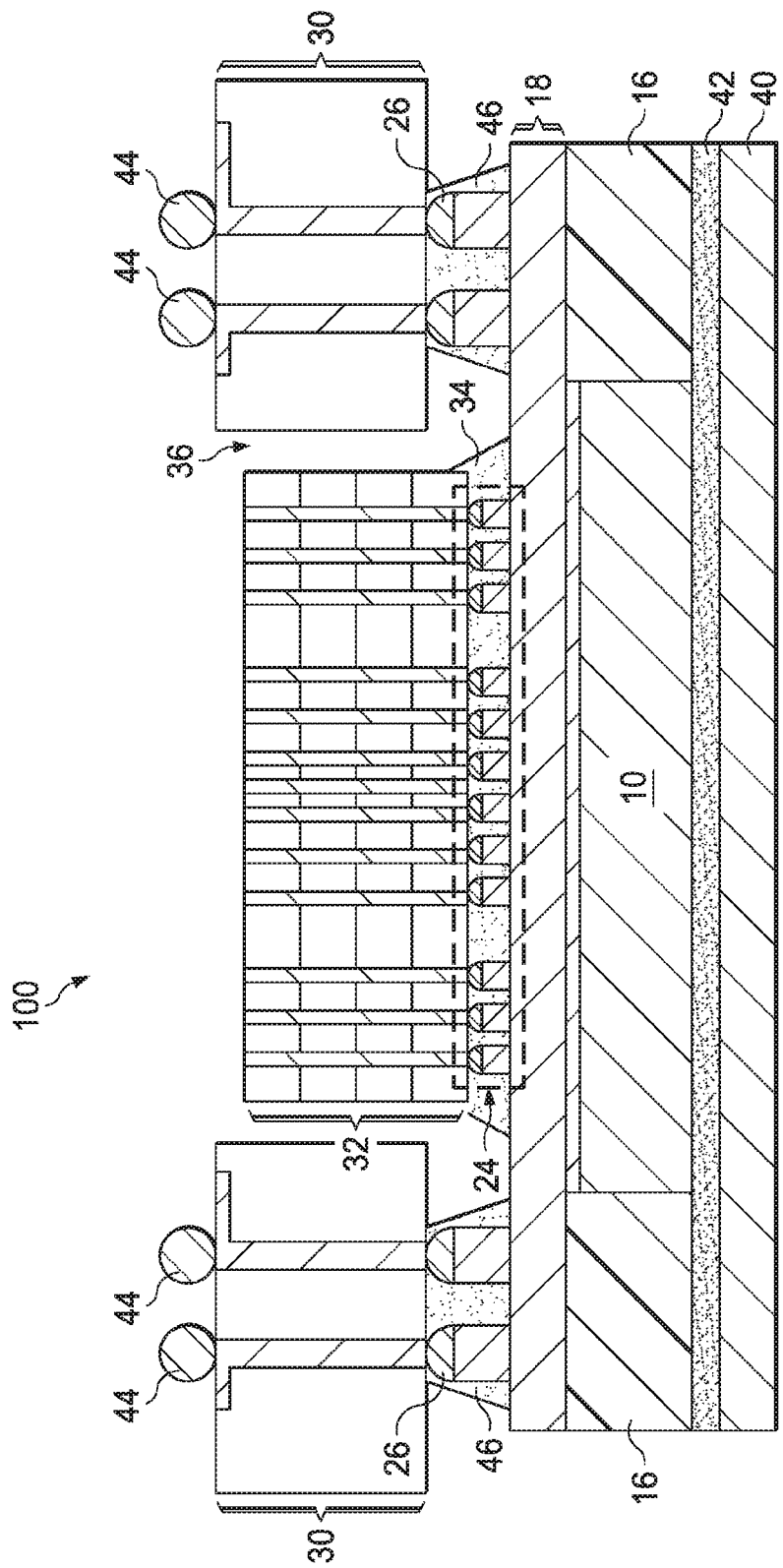

Subsequently, functional tests may be performed on package 100 prior to the attachment of dies 32. For example, electrical connections between die 10 and package substrate 30 may be tested. If package 100 passes the tests, dies 32 may be attached to package 100 through connectors 24 as illustrated by FIG. 2D. By performing functional tests on package 100 prior to the attachment of dies 32, dies 32 may be attached to only to known good packages. Packages that fail the functional tests may not have dies 32 attached thereto. Thus, cost savings may be incurred by avoiding attachment of dies 32 to failed packages.

Dies 32 may be disposed in through hole 36 of package substrate. Attaching dies 32 may include flipping package 100 (e.g., so that connectors 24 face upwards) and aligning dies 32 in through hole 36. A reflow may be performed on connectors 24 (e.g., to electrically connect dies 32 to die 10/package substrate 30), an underfill may be dispensed around connectors 24. Thus, an alternative manufacturing process may be used to form package 100.

FIG. 3 illustrates a cross-sectional view of a package 200 in accordance with various alternative embodiments. Package 200 may be substantially similar to the package 100 where like reference numerals represent like elements. However, heat dissipation feature 40 may include a contour ring portion 40', which may extend past die 10 and RDLs 18 to a top surface of package substrate 30. In a top down view of package 200 (not shown), contour ring portion 40' may encircle die 10. Contour ring portion 40' may be formed of substantially similar materials as the remainder of heat dissipation lid 40 (e.g., a high Tk material) and provide additional heat dissipation for package 200. Contour ring portion 40' may be attached to package substrate 30 using any suitable method such as an adhesive layer 42' disposed between contour ring portion 40' and package substrate 30.

FIGS. 4A through 4E illustrate cross-sectional views of a package 300 in accordance with various alternative embodiments. Package 300 may be substantially similar to the package 100 where like reference numerals represent like elements. However, package 300 may further include a second heat dissipation feature 50 on dies 32. Heat dissipation feature 50 may be substantially similar to heat dissipation feature 40, and heat dissipation feature 50 may be attached an opposite surface of dies 32 as connectors 24/RDL 18 using any suitable method (e.g., adhesive). Interfacing material 48, which may be substantially similar to interfacing material 42, may be disposed between heat dissipation feature 50 and dies 32. The attachment of heat dissipation feature 50 may be performed at any point in the manufacturing process, for example, after dies 32 and/or substrate 30 is bonded to die 10. Heat dissipation feature 50 allows for improved heat dissipation in package 300 (specifically dies 32). Furthermore, the inclusion of two separate heat dissipation features 40 and 50 allow for each heat dissipation feature to be relatively simplistic in design while still providing sufficient heat dissipation in package 300.

Figure 4E:
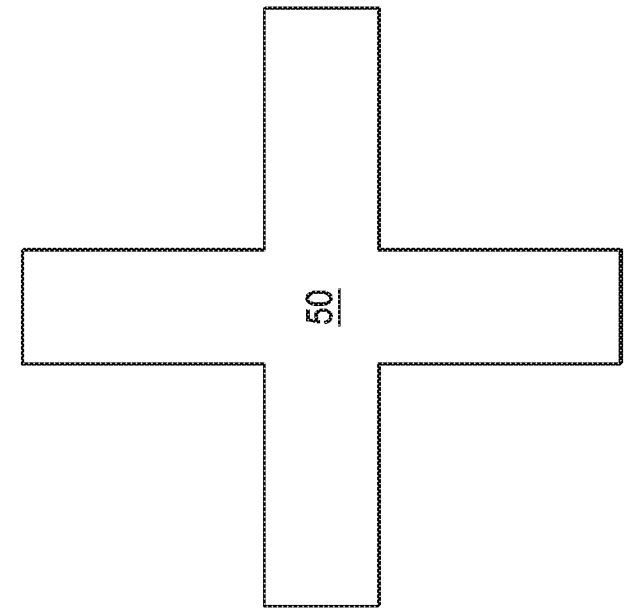
Figure 4D:
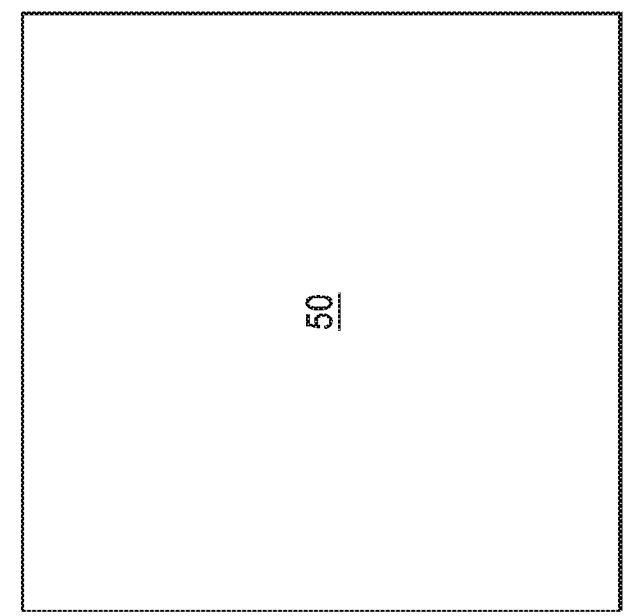

The configuration of heat dissipation feature 50 may vary in different embodiments. For example, heat dissipation feature 50 may (as illustrated by FIGS. 4B and 4C) or may not (as illustrated by FIG. 4A) extend over portions of package substrate 30. In embodiments where heat dissipation feature 50 does extend over portions of substrate 30, interfacing material 48 may also be disposed between substrate 30 and heat dissipation feature 50. Furthermore, the shape of heat dissipation feature 50 may vary both in a cross-sectional view (as illustrated by FIGS. 4A through 4C) and top down views (as illustrated by FIGS. 4D and 4E). The shape of heat dissipation feature 50 may be selected based on various criteria such as heat dissipation requirements of package 300, manufacturing costs, the configuration of other device components (e.g., contacts 44) on package substrate 30/dies 32, and the like. For example, in a top down view, the shape and size of heat dissipation feature 50 may be selected so as to avoid other elements disposed on a surface of package substrate 30.

Thus, as described above, a package may be formed have a first die (e.g., a logic die) and RDLs disposed over the first die. One or more second dies (e.g., memory dies) may be electrically connected to the first die through the RDLs. The resulting die stack may be bonded to a package substrate (e.g., a printed circuit board) where electrical connections from the second dies to the package substrate may be made through the RDLs and the first die. The package substrate and the second dies may be connected to a same side of the first die. The package substrate may include a through hole, and the second dies may be disposed in the through hole. One or more heat dissipation features may be disposed on the first die and/or the second dies. Thus, the resulting package structure may have a relatively thin form factor, relatively simplistic heat dissipation features (e.g., having a simple design) while still maintaining thermal performance, improved bandwidth (e.g., do the thin form factor), improved speed (e.g., due to shorter signaling paths), improved power characteristics (e.g., due to shorter conductive lines to power/ground layers), and the like.

In accordance with an embodiment, a device includes a first die, a second die electrically connected to the first die, and a heat dissipation surface on a surface of the second die. The device further includes a package substrate electrically connected to the first die. The package substrate includes a through-hole, and the second die is at least partially disposed in the through hole.

In accordance with another embodiment, a device includes a first die and one or more redistribution layers (RDLs) on a first surface of the first die. A first plurality of connectors on a surface of the one or more RDLs, and one or more second dies bonded to the first die through the first plurality of connectors. A second plurality of connectors on the surface of the one or more RDLs, and a package substrate bonded to the first die through the second plurality of connectors. The device further includes a first heat dissipation feature on a second surface of the first die opposite the first surface and a second heat dissipation feature on a surface of the one or more second dies.

In accordance with yet another embodiment, a method includes forming first connectors on a first side of a first die and bonding a second die to the first die using the first connectors. The method further includes forming second connectors on the first side of the first die, bonding a package substrate to the first die using the second connectors, and attaching a heat dissipation feature to a surface of the second die. The package substrate includes a through hole, and the second die is disposed at least partially in the through hole.

In accordance with an embodiment, a method includes forming first connectors on a first side of a first die, bonding a second die to the first die using the first connectors, and forming second connectors on the first side of the first die. The second connectors have a different pitch than the first connectors. The method further includes bonding a package substrate to the first die using the second connectors. The package substrate includes a through hole, and the second die is at least partially disposed in the through hole. The method further includes attaching a first heat dissipation feature to a surface of the second die.

In accordance with an embodiment, a method includes forming a first plurality of connectors on a first surface of a first package component. The first package component includes a first die. The method further includes bonding a package substrate to the first plurality of connectors. A through hole extends through the package substrate. The method further includes bonding one or more second dies to the first package component using a second plurality of connectors. The second plurality of connectors is disposed on the first surface of the first package component, and the one or more second dies is disposed at least partially in the through hole. The method further includes attaching a first heat dissipation feature to the first die and attaching a second heat dissipation feature to the one or more second dies. The first heat dissipation feature is disposed on an opposing side of the first die as the package substrate. The second heat dissipation feature includes a first portion directly attached to the one or more second dies by a first interfacing material and a second portion directly attached to a second surface of the package substrate opposite the first package component by a second interfacing material. A third connector is disposed adjacent the second portion of the second heat dissipation feature on the second surface of the package substrate.

In accordance with an embodiment, a method includes bonding a package substrate to a first package component using a first plurality of connectors disposed on a surface of the first package component. The first package component includes a first die. The method further includes bonding one or more second dies to the first package component using a second plurality of connectors disposed on the surface of the first package component. The one or more second dies is disposed at least partially in a through hole extending through the package substrate. The method further includes attaching a first heat dissipation feature to the first die and attaching a second heat dissipation feature to the one or more second dies. The second heat dissipation feature includes a first portion disposed at least partially in the through hole and a second portion outside of the through hole. The first portion is disposed between the second portion and the one or more second dies. The first portion protrudes from the second portion. A substantially level top surface of the second portion is directly attached to a surface of the package substrate by an interfacing material, and the substantially level top surface of the second portion extends continuously from a sidewall of the second portion to a sidewall of the first portion The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming first connectors on a first side of a first die, wherein forming the first connectors comprise forming a solder region on the first side of the first die;
    after forming the first connectors, bonding a second die to the first die by directly contacting the second die to the solder regions of the first connectors;
    forming second connectors on the first side of the first die, wherein the second connectors have a different pitch than the first connectors;
    bonding a package substrate to the first die using the second connectors, wherein the package substrate comprises a through hole, and wherein the second die is at least partially disposed in the through hole;
    dispensing a first underfill around the first connectors;
    dispensing a second underfill around the second connectors, wherein the second underfill is physically separate from the first underfill, and wherein a virtual line parallel to a major surface of the first die extends through the second underfill and the second die, wherein the first underfill and the second underfill are disposed on a same surface as the first connectors and the second connectors, and wherein a first fillet of the first underfill extends further from the same surface than a second fillet of the second underfill; and
    attaching a first heat dissipation feature to a surface of the second die.

2. The method of claim 1, wherein bonding the second die to the first die using the first connectors is performed before bonding the package substrate to the first die using the second connectors.

3. The method of claim 1, wherein bonding the second die to the first die using the first connectors is performed after bonding the package substrate to the first die using the second connectors.

4. The method of claim 1, further comprising:
    encapsulating the first die in a molding compound; and
    forming redistribution layers on the first side of the first die, wherein the redistribution layers electrically connect the first connectors and the second connectors to the first die.

5. The method of claim 1 further comprising attaching a second heat dissipation feature to a second side of the first die opposite the first side.

6. The method of claim 1 further comprising attaching the first heat dissipation feature to a surface of the package substrate opposite the first die.

7. The method of claim 6 further comprising disposing a solder region on the surface of the package substrate, wherein the solder region is adjacent the first heat dissipation feature.

8. A method comprising:
    forming a first plurality of connectors on a first surface of a first package component, wherein the first package component comprises a first die;
    bonding a package substrate to the first plurality of connectors, wherein a through hole extends through the package substrate;
    bonding one or more second dies to the first package component using a second plurality of connectors, wherein the second plurality of connectors is disposed on the first surface of the first package component, and wherein the one or more second dies is disposed at least partially in the through hole;
    dispensing a first underfill around the first plurality of connectors; and
    dispensing a second underfill around the second plurality of connectors, wherein the second underfill is physically separate from the first underfill, wherein the first underfill and the second underfill are disposed on a same surface of the first package component, and wherein a first fillet of the first underfill extends further from the same surface of the first package component than a second fillet of the second underfill;
    attaching a first heat dissipation feature to the first die, wherein the first heat dissipation feature is disposed on an opposing side of the first die as the package substrate; and
    attaching a second heat dissipation feature to the one or more second dies, wherein the second heat dissipation feature comprises:

a first portion directly attached to the one or more second dies by a first interfacing material; and a second portion directly attached to a second surface of the package substrate opposite the first package component by a second interfacing material, and wherein a third connector is disposed adjacent the second portion of the second heat dissipation feature on the second surface of the package substrate.

9. The method of claim 8, wherein the first plurality of connectors have a different size than the second plurality of connectors.

10. The method of claim 8, wherein the third connector comprises a solder region.

11. The method of claim 8, wherein the first die is encapsulated in a molding compound, and wherein one or more redistribution layers electrically connect the first plurality of connectors and the second plurality of connectors to the first die.

12. The method of claim 8, wherein the first heat dissipation feature and the second heat dissipation feature have different shapes in a cross-sectional view.

13. A method comprising:

bonding a package substrate to a first package component using a first plurality of connectors disposed on a surface of the first package component, wherein the first package component comprises a first die;

bonding one or more second dies to the first package component using a second plurality of connectors disposed on the surface of the first package component, the one or more second dies is disposed at least partially in a through hole extending through the package substrate;

attaching a first heat dissipation feature to the first die;

attaching a second heat dissipation feature to the one or more second dies, wherein the second heat dissipation feature comprises:

a first portion disposed at least partially in the through hole, wherein the first portion is physically separated from a sidewall of the package substrate by a gap; and a second portion outside of the through hole, wherein the first portion is disposed between the second portion and the one or more second dies, wherein the first portion protrudes from the second portion, wherein a substantially level top surface of the second portion is attached to a surface of the package substrate opposite the first package component by an interfacing material, the interfacing material extends continuously from the second portion to the surface of the package substrate, wherein the substantially level top surface of the second portion extends continuously from a sidewall of the second portion to a sidewall of the first portion, and wherein the gap physically separating the first portion from the sidewall of the package substrate extends to the substantially level top surface of the second portion; and contacting a solder region to the surface of the package substrate, the solder region extends further from the surface of the package substrate than the second heat dissipation feature.

14. The method of claim 13, wherein the first heat dissipation feature is disposed on an opposing side of the first die as the package substrate.

15. The method of claim 13, wherein the second portion is wider than the first portion.

16. The method of claim 13, wherein the first heat dissipation feature and the second heat dissipation feature are disposed on opposing sides of the first package component.

17. The method of claim 13, wherein first plurality of connectors are formed at a different time than the second plurality of connectors.

18. The method of claim 13, wherein a surface of the second heat dissipation feature opposite the one or more second dies is non-planar.

* * * * *